(12) United States Patent
Kawaguchi

(10) Patent No.: US 8,994,365 B2
(45) Date of Patent: Mar. 31, 2015

(54) CURRENT DETECTION APPARATUS

(75) Inventor: Yasunori Kawaguchi, Shimada (JP)

(73) Assignee: Yazaki Corporation, Tokyo (JP)

( * ) Notice: Subject to any disclaimer, the term of this patent is extended or adjusted under 35 U.S.C. 154(b) by 62 days.

(21) Appl. No.: 13/637,841

(22) PCT Filed: Apr. 28, 2011

(86) PCT No.: PCT/JP2011/060369
§ 371 (c)(1),
(2), (4) Date: Sep. 27, 2012

(87) PCT Pub. No.: WO2011/136328
PCT Pub. Date: Nov. 3, 2011

(65) Prior Publication Data
US 2013/0015842 A1   Jan. 17, 2013

(30) Foreign Application Priority Data
Apr. 28, 2010   (JP) .................................. 2010-104291

(51) Int. Cl.
*G01R 33/00* (2006.01)
*G01R 15/20* (2006.01)
*G01R 1/18* (2006.01)

(52) U.S. Cl.
CPC .............. *G01R 15/202* (2013.01); *G01R 1/18* (2013.01)
USPC ........................ 324/200; 324/263; 324/117 H

(58) Field of Classification Search
CPC ................................ G01R 1/18; G01R 15/202
USPC ...................... 324/117 H, 200–263
See application file for complete search history.

(56) References Cited

U.S. PATENT DOCUMENTS

2009/0278526 A1\* 11/2009 Yoshida .................... 324/117 H
2010/0156394 A1\* 6/2010 Ausserlechner et al. ..... 324/144

FOREIGN PATENT DOCUMENTS

| CN | 101013144 A | 8/2007 |
| JP | 06-074975 A | 3/1994 |
| JP | 2000-275279 A | 10/2000 |
| JP | 2007-155400 A | 6/2007 |
| JP | 2007-303952 A | 11/2007 |

(Continued)

OTHER PUBLICATIONS

International Search Report for PCT/JP2011/060369 dated Aug. 9, 2011 [PCT/ISA/210].

(Continued)

*Primary Examiner* — Jermele M Hollington
*Assistant Examiner* — Farhana Hoque
(74) *Attorney, Agent, or Firm* — Sughrue Mion, PLLC

(57) ABSTRACT

A current detection apparatus includes two magnetic detectors that are arranged oppositely on a front surface and a back surface of a board which is located above a current path in order to detect a strength of a magnetic field, an electromagnetic shielding frame member that is mounted on the current path so that the two magnetic detectors and a part of the current path are accommodated inside the electromagnetic shielding frame member, and a control circuit that determines whether a failure which occurs in either of the two magnetic detectors from a difference between magnetic fields detected by the two magnetic detectors, respectively. Sensitivities of the two magnetic detectors are made adjusted so that current values outputted from the two magnetic detectors depending on detected magnetic fields are identical to each other in a normal state.

3 Claims, 5 Drawing Sheets

(56) References Cited

FOREIGN PATENT DOCUMENTS

| JP | 2009-270910 A | 11/2009 |
|----|---------------|---------|
| JP | 2009-276359 A | 11/2009 |
| JP | 2010-078537 A | 4/2010 |
| JP | 2010-127896 A | 6/2010 |

OTHER PUBLICATIONS

Written Opinion for PCT/JP2011/060369 dated Aug. 9, 2011 [PCT/ISA/237].

Office Action, dated Oct. 1, 2013, issued by the Japanese Patent Office, in counterpart Application No. 2010-104291.

Notification of Information Offer Form dated Jun. 3, 2014, issued by the Japanese Patent Office in counterpart Japanese Patent Application No. 2010-104291.

Communication dated Mar. 25, 2014 issued by the State Intellectual Property Office of the People's Republic of China in counterpart Chinese Patent Application No. 201180021550.6.

Office Action dated Nov. 17, 2014, issued by the State Intellectual Property Office of the People's Republic of China in counterpart Chinese Application No. 201180021550.6.

Office Action dated Nov. 4, 2014, issued by the Japanese Patent Office in counterpart Japanese Application No. 2010-104291.

\* cited by examiner

CURRENT DETECTION APPARATUS

TECHNICAL FIELD

The present invention relates to a current detection apparatus which uses a magnetic detector which is provided near a current path in an electronic equipment of a car such as a motor to detect a value of a current which flows in the current path, and particularly to a current detection apparatus which can detect a failure which occurs in the magnetic detector.

BACKGROUND ART

In order to detect a current which flows in a current path (for example, in a bus bar) which connects an in-vehicle battery of a vehicle and electronic equipments of the vehicle, a current detection apparatus is used. For example, as shown in Patent Literature 1, the current detection apparatus includes a core of a ring shape, a magnetic gap which is formed by opening a part of the core, and a Hall element which is arranged in the magnetic gap, and is configured so that the value of a current which flows in the current path which is inserted into the core of a ring shape is detected by the Hall element which is arranged in the magnetic gap.

Therefore, in the current detection apparatus, when a magnetic field is generated in the core of the ring shape by the current which flows in the current path, the Hall element in the magnetic gap generates a voltage (Hall voltage) due to Hall Effect in accordance with the magnetic field. At this time, the core functions to strengthen the magnetic field generated by the current which flows in the current path. Since the Hall voltage which the Hall element generates corresponds to the magnetic field strength in the core and corresponds to the value of the current which flows in the current path which generates the magnetic field, the current value can be detected.

In such current detection apparatus, in order to obtain a detection current in a sufficient level so that current detection performance may not be dropped, two Hall elements are provided in the magnetic gap of the core. Thereby, compared with the case of one Hall element, a current in almost two times levels can be detected. The two Hall elements are juxtaposed in the thickness direction of the core or the direction of magnetic force lines which pass the magnetic gap.

Thus, in the related-art current detection apparatus, a current in a desired level can be detected by providing two Hall elements in the magnetic gap of the core.

CITATION LIST

Patent Literatures

Patent Literature 1: JP-A-2007-155400
Patent Literature 2: Japanese Patent Application No. 2008-306360

SUMMARY OF INVENTION

Technical Problem

However, in the related-art current detection apparatus, since the core of the ring shape in which the two Hall elements are provided in the magnetic gap is required, there is an inconvenience that the size of the whole device becomes large, and there is also an inconvenience with a restriction of a mounting structure of the core with respect to the current path due to the fact that the current path is put inside the core.

Although the current detection apparatus disclosed in Patent Literature 2 makes the core of a ring shape unnecessary, two magnetic detectors must be arranged on the same plane, which also becomes disadvantageous for the downsizing of the whole device in this case. Patent Literature 2 is disclosed on Jun. 10, 2010 as JP-A-2010-127896.

The present invention is made in view of the situation mentioned above, and an object of the invention is to provide a current detection apparatus which enables the downsizing of the apparatus, and which can perform failure determination of Hall elements with high precision without being affected by an external magnetic field.

Solution to Problem

The above object of the invention is achieved by the following configuration.

(1) A current detection apparatus, including:
two magnetic detectors that are arranged oppositely on a front surface and a back surface of a board which is located above a current path in order to detect a strength of a magnetic field which is generated by a current which flows in the current path;
an electromagnetic shielding frame member that is mounted on the current path so that the two magnetic detectors and a part of the current path where the two magnetic detectors are arranged are accommodated inside the electromagnetic shielding frame member; and
a control circuit that determines whether a failure which occurs in either of the two magnetic detectors from a difference between magnetic fields detected by the two magnetic detectors, respectively, wherein
sensitivities of the two magnetic detectors are adjusted so that current values outputted from the two magnetic detectors depending on detected magnetic fields are identical to each other in a normal state.

According to the current detection apparatus, since it is not necessary to include the core in structure like before and at least only one magnetic detector should be arranged at the same plane, the simplification and downsizing of the current detection apparatus are possible, and failure determination of the magnetic detectors (Hall elements) can be easily performed without being affected by an external magnetic field.

(2) The current detection apparatus according to the configuration (1), wherein each of the two magnetic detectors is arranged to be located at a center of the current path in its widthwise direction.

According to the current detection apparatus, since the magnetic detectors are arranged at parts where the magnetic field strength generated from the current path becomes the largest easily, the size of the current which flows through the current path can be measured with sufficient precision.

Advantageous Effects of Invention

According to the current detection apparatus of the invention, since it is not necessary to include the core in structure like before and only at least one magnetic detector should be arranged at the same plane, the simplification and downsizing of the current detection apparatus are possible, and failure determination of the magnetic detectors (Hall elements) can be easily performed without being affected by an external magnetic field.

MODES FOR CARRYING OUT INVENTION

Next, a preferred embodiment of the current detection apparatus according to the invention is described with reference to the figures. In the embodiment, a Hall IC is adopted as a magnetic detector which detects the strength of a magnetic field generated by a current which flows through a current path.

Figure 1:
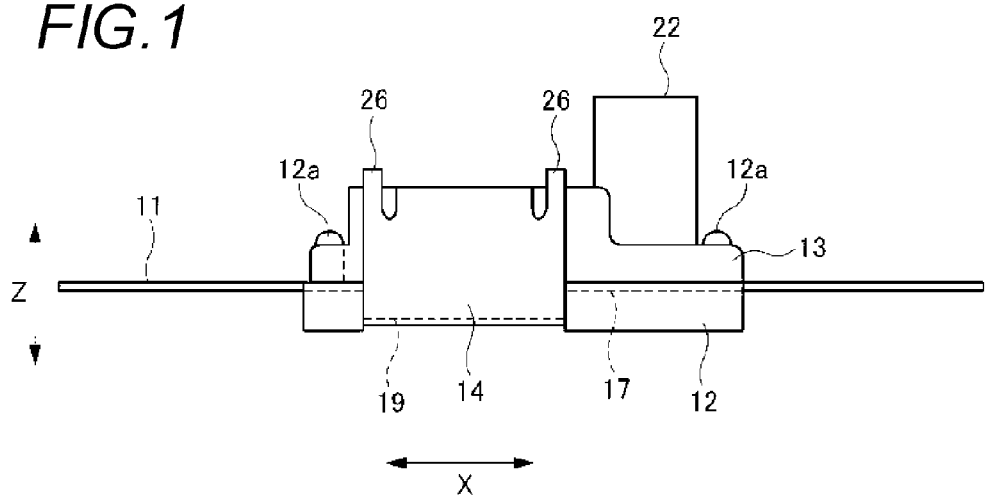
FIG. 1 is a side view of a current detection apparatus according to the present invention.
Figure 2:
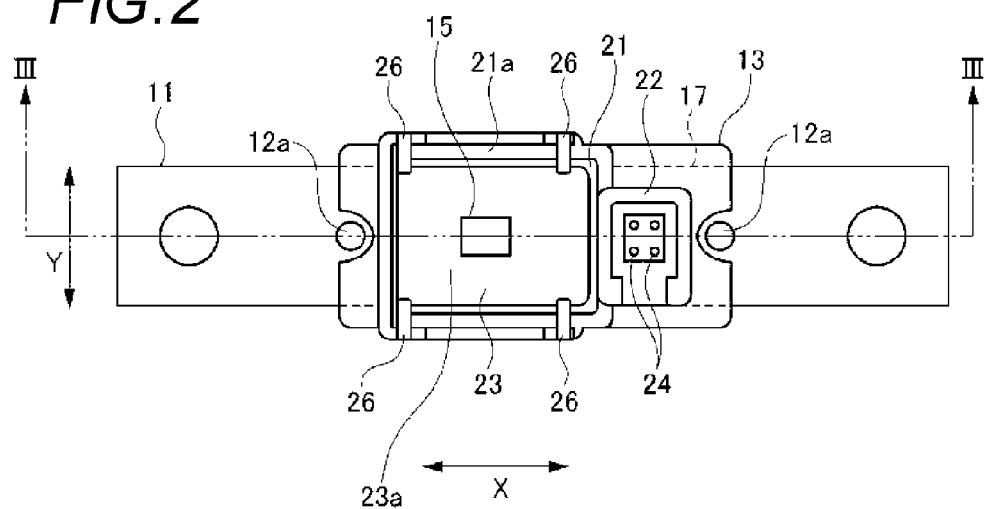
FIG. 2 is a top view of the current detection apparatus shown in FIG. 1.
Figure 3:
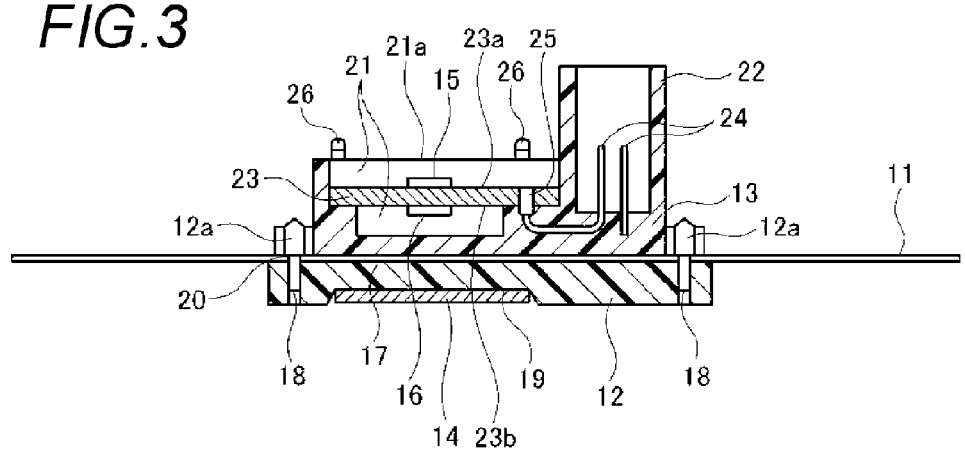
FIG. 3 is a sectional view of the current detection apparatus taken along a line indicated by shown in FIG. 2.
Figure 4:
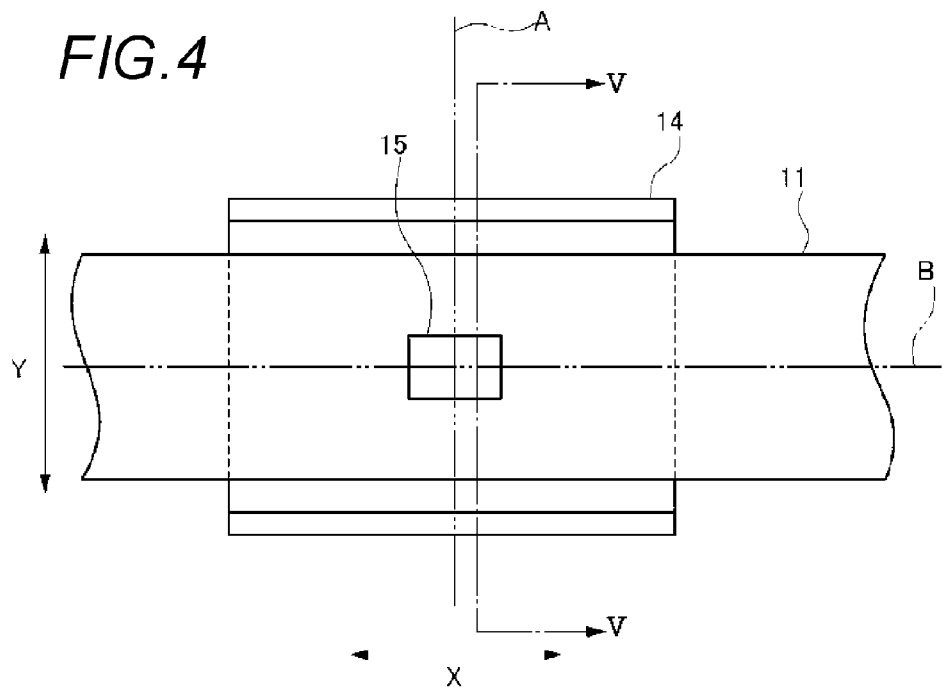
FIG. 4 is a top view for conceptually describing the installed position of a magnetic detector which forms a Hall IC shown in FIG. 2 inside an electromagnetic shielding frame member.
Figure 5:
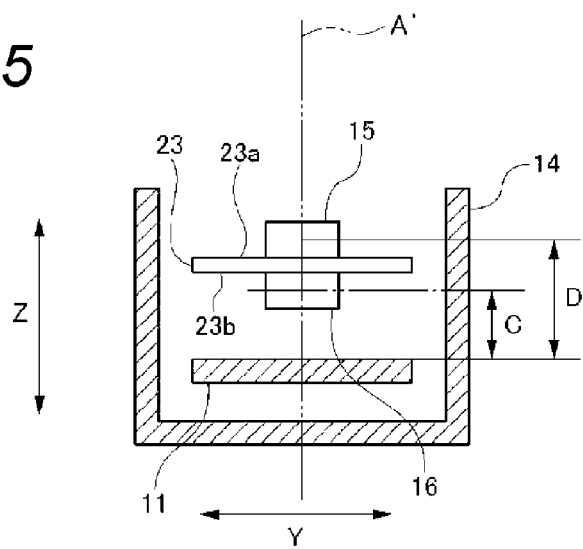
FIG. 5 is a sectional view inside the electromagnetic shielding frame member taken along a line indicated by V-V shown in FIG. 4.
Figure 6:
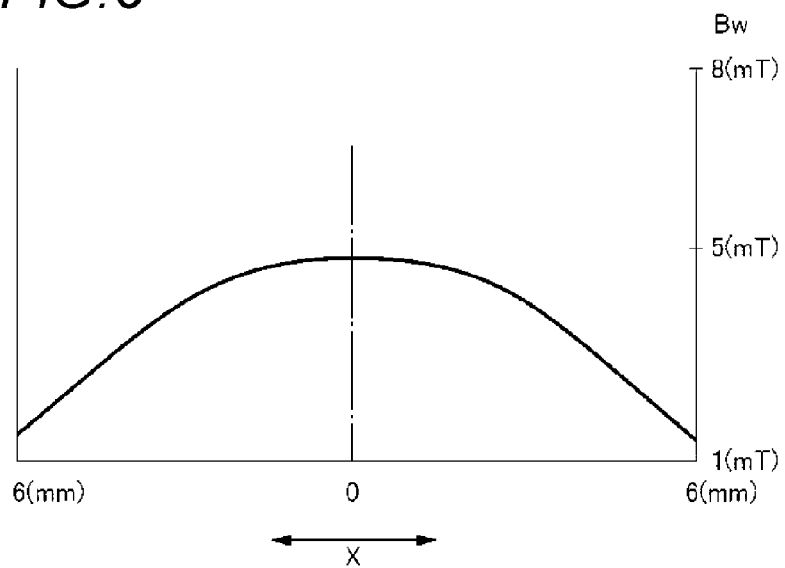
FIG. 6 is an explanatory view which shows the distribution of magnetic flux Bw in a widthwise direction of a bus bar which a current path generates in the electromagnetic shielding frame member.
Figure 7:
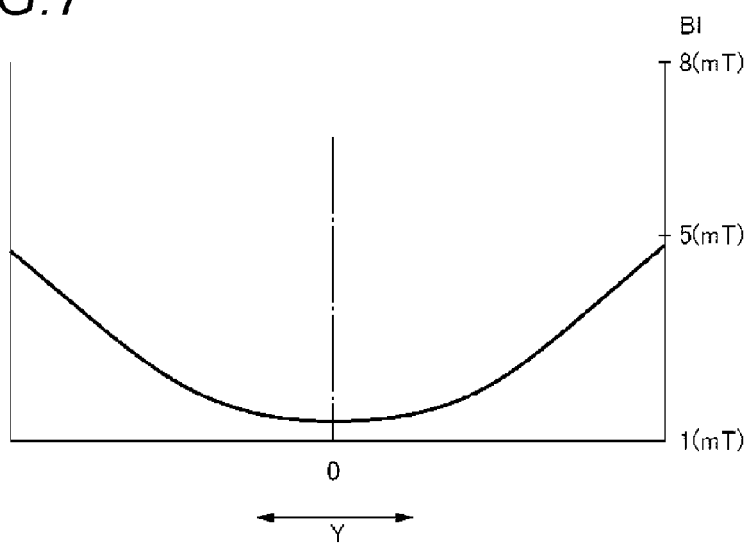
FIG. 7 is an explanatory view which shows the distribution of magnetic flux Bl in a longitudinal direction of the bus bar which a current path generates in the electromagnetic shielding frame member.
Figure 8:
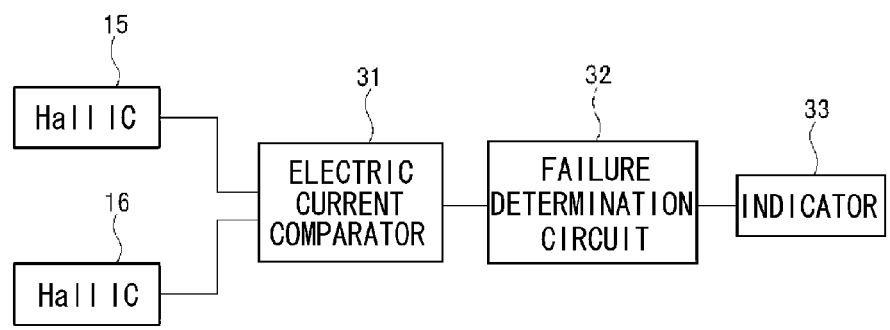
FIG. 8 is a block diagram which shows a failure detecting circuit of the current detection apparatus.
Figure 9:
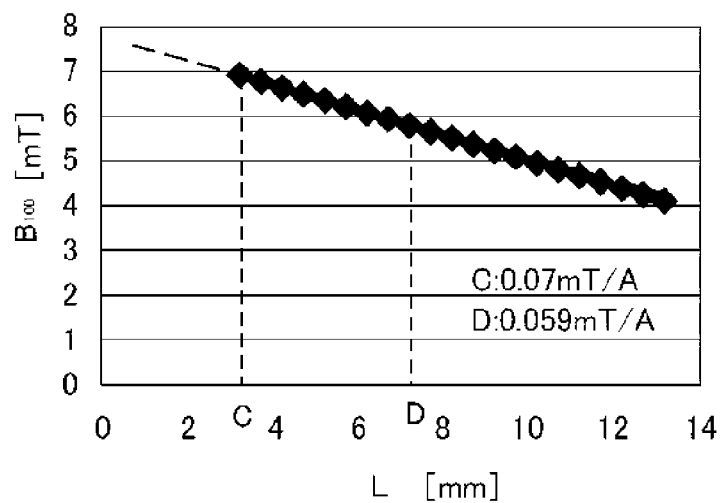
FIG. 9 is a graph which indicates a correlation of the distance in the Y direction from the Y center position with magnetic flux density.
Figure 10:
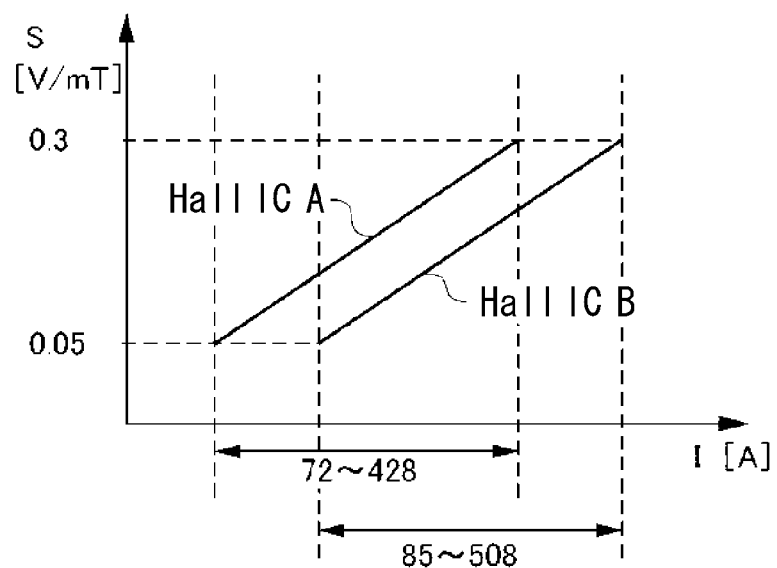
FIG. 10 is a graph which shows failure detection regions when two Hall ICs whose sensitivities can be adjusted are used.

FIG. 1 is a side view of the current detection apparatus according to the present invention. FIG. 2 is a top view of the current detection apparatus shown in FIG. 1. FIG. 3 is a sectional view of the current detection apparatus taken along a line indicated by shown in FIG. 2. FIG. 4 is a top view for conceptually describing the installed position of a magnetic detector which forms a Hall IC shown in FIG. 2 inside an electromagnetic shielding frame member. FIG. 5 is a sectional view inside the electromagnetic shielding frame member taken along a line indicated by V-V shown in FIG. 4. FIG. 6 is an explanatory view which shows the distribution of magnetic flux Bw in a widthwise direction of a bus bar which a current path generates in the electromagnetic shielding frame member. FIG. 7 is an explanatory view which shows the distribution of magnetic flux in a longitudinal direction of the bus bar which a current path generates in the electromagnetic shielding frame member. FIG. 8 is a block diagram which shows a failure detecting circuit of the current detection apparatus. FIG. 9 is a graph which indicates a correlation of the distance in the Y direction from the Y center position with magnetic flux density. FIG. 10 is a graph which shows failure detection regions when two Hall ICs whose sensitivities can be adjusted are used.

The current detection apparatus of the embodiment includes a base block 12 and a terminal block 13 as housing which forms an external shape of the current detection apparatus, an electromagnetic shielding frame member 14 which covers the side surfaces of the base block 12 and the terminal block 13, and two Hall ICs 15, 16 which are attached onto the terminal block 13. The base block 12 is a housing which is located below a bus bar 11 (lower side in FIGS. 1 and 3), and is fixed to the bus bar 11. On the other hand, the terminal block 13 is a housing which is located above the bus bar 11, and is fixed when being placed on the base block 12. The electromagnetic shielding frame member 14 is mounted on the bus bar 11 so that the two Hall ICs 15, 16 and a part of the bus bar 11 which is arranged near the Hall ICs 15, 16 are contained inside.

If a current flows in the bus bar 11, a magnetic field will occur around the bus bar 11. The magnetic field is detected by each of Hall elements (magnetism detecting elements) in the Hall ICs 15, 16 which are installed on the terminal block 13, and a voltage which each of the Hall elements detects is amplified by an amplifying circuit in each of the Hall ICs 15, 16, and a voltage value which is proportional to the detected magnetic field is output. That is, based on the output from the Hall element, the detection of the value of a current which flows in the bus bar 11 is performed.

The base block 12 is molded of insulating material, such as plastic, and a fitting notch (concave groove) 17 which accommodates a specified length of the bus bar 11 and fits to the bus bar 11 is formed on the top surface of the base block 12. Threaded holes 18 which are penetrated through from top to bottom are provided near both ends in the length direction (X direction shown in FIG. 2) of the base block 12. These threaded holes 18 are used to screw the bus bar 11 tightly onto the base block 12. A fitting notch (concave groove) 19 for the electromagnetic shielding frame member 14, which covers the side surfaces (side surfaces in the Y direction) of the base block 12 and the terminal block 13 for a specified width in the length direction (X direction) and the bottom surface of the base block 12, is formed on the bottom surface of the base block 12. When the electromagnetic shielding frame member 14 is mounted on the base block 12 and the terminal block 13, the electromagnetic shielding frame member 14 is accommodated in the fitting notch (concave groove) 19.

The bus bar 11 is a conductive plate whose widthwise (Y direction) dimension is constant, and mounting holes 20 are provided to be penetrated at parts corresponding to the threaded holes 18 formed in the base block 12. Therefore, by installing the bus bar 11 to the fitting notch 17 on the base block 12, and screwing stop screws 12a into the threaded holes 18 through the mounting holes 20 from the top surface of the bus bar 11, the bus bar 11 can be strongly attached to the base block 12. Thereby, the bus bar 11 is stably supported by the base block 12.

The terminal block 13 is molded of insulating plastic material, and is placed on the base block 12. The terminal block 13 has integrally an IC receiving recess 21 for receiving Hall ICs and a connector insertion cylinder 22 for accommodating a mating connector (not shown in the figures). An insulative board 23 is fixed to the IC receiving recess 21, and the two Hall ICs 15, 16 and conductive circuit patterns (not shown in the figures) are arranged on the front and back surfaces 23a and 23b of the insulative board 23. Each of the Hall ICs 15, 16 are a chip which integrates a Hall element and an amplifying circuit as a magnetic detector, and an analog type chip which outputs a voltage proportional to the detected magnetic field strength is used. The amplifying circuit amplifies the voltage output, and converts the voltage output to a current value and outputs the result. The arrangement parts of the Hall ICs 15, 16 to the IC receiving recess 21 are described later.

On the other hand, one end of each of a plurality of connector pins 24 is protruded from the bottom of the connector insertion cylinder 22, and the other end of each of these connector pins 24 is embedded in the terminal block 13. The other ends of the connector pins 24 which are embedded in the terminal block 13 are connected to the connection terminals of the Hall ICs 15, 16 via leads 25 which are embedded in the insulative board 23. When a female connector (not shown in the figures) is fitted in the connector insertion cylinder 22, and connecter terminals at the side of the female connector are inserted into the connector pins 24, the output signals of the Hall ICs 15, 16 can be extracted to an external circuit.

The electromagnetic shielding frame member 14 is formed in a U shape so that the side surfaces of the base block 12 and the terminal block 13 (especially those portions that faces the side surfaces of the IC receiving recess 21 which accommodates the Hall ICs 15, 16 among the side surfaces of the base block 12 and the terminal block 13) are covered, and is fitted into the fitting notch 19 of the base block 12 as mentioned above. In the electromagnetic shielding frame member 14, crimp claws 26 which are protruded in the height direction (Z axial direction) are formed at ends of the parts where the side surfaces of the base block 12 and the terminal block 13 are covered, and the crimp claws 26 are crimped and attached to upper opening edges 21a of the IC receiving recess 21. When the bus bar 11 and the base block 12 which is attached to the bus bar 11 are received inside the U shape, by crimping and attaching the crimp claws 26 of the electromagnetic shielding frame member 14 to the upper opening edges 21a of the IC receiving recess 21, the terminal block 13 placed above the base block 12 is firmly held on the base block 12. Therefore, the bus bar 11 is also definitely held between the blocks 12 and 13. Electromagnetic waves can be prevented from being propagated from the outside of the IC receiving recess 21 to the inside of the IC receiving recess 21 when the electromagnetic shielding frame member 14 covers the side surfaces of the IC receiving recess 21.

The long bus bar 11 is inserted into the fitting notch 17 formed in the central part of the base block 12, as mentioned above. It is preferable to adjust the shape of the base block 12 and the cut length of the fitting notch 17 so that a center line (a straight line passing through the center of the widthwise direction of the bus bar 11) of the bus bar 11 and a center line (a straight line passing through the center of the widthwise direction of the top surface of the base block 12) of the base block 12 are in agreement when the base block 12 is viewed from the top. FIG. 4 shows that the center line of the bus bar 11 and the center line of the base block 12 are in agreement with a center line B. By making widthwise (Y direction) dimensions of the base block 12 and the terminal block 13 which is placed on the base block 12 to become equal, the center of the widthwise direction (Y direction) of the electromagnetic shielding frame member 14 which covers the base block 12 and the terminal block 13 corresponds with each of the center lines.

The electromagnetic shielding frame member 14 prevents the propagation of electromagnetic waves to the inside of the IC receiving recess 21, and inside the electromagnetic shielding frame member 14 when the bus bar 11 is installed to the electromagnetic shielding frame member 14, the strength of the magnetic field generated from the bus bar 11 is distributed symmetrically to a plane A. As shown in FIG. 4, the plane A is a plane which intersects perpendicularly in the length direction (X direction) of the electromagnetic shielding frame member 14, and is a plane which is located in the center of both ends of the length direction of the electromagnetic shielding frame member 14. In this embodiment, in order to cause the strength of the magnetic field generated from the bus bar 11 to be distributed symmetrically to the plane A inside the electromagnetic shielding frame member 14, by causing the shape of the electromagnetic shielding frame member 14 to be a rectangular parallelepiped and setting the plane A which divides the rectangular parallelepiped into two rectangular parallelepipeds of the same shape, the distribution of the magnetic field strength inside the electromagnetic shielding frame member 14 symmetric. Then, in the center line B which passes the centers of the Hall ICs 15, 16 and is placed at a height C in the Z direction from the bottom wall in the electromagnetic shielding frame member 14, the distribution of magnetic flux Bw which the bus bar 11 generates inside the electromagnetic shielding frame member 14 is as shown in FIG. 6. In the distribution of FIG. 6, the width indicates positions in the X direction with the position of the plane A as 0 (since the length of the electromagnetic shielding frame member 14 is 12 mm in the length direction, the maximum of X width is assumed as 6 mm and the minimum is assumed as −6 mm.), and the vertical axis indicates strength Bw of the magnetic field. Inside the electromagnetic shielding frame member 14, the magnetic field strength is distributed to be the largest near the center 0 of the electromagnetic shielding frame member 14 in the length direction (in FIG. 6, about 5 mT), and decrease as towards both ends of the electromagnetic shielding frame member 14 in the length direction (in FIG. 6, about 1.4 mT). That is, the magnetic field strength is distributed to decrease symmetrically from the plane A towards the both ends (each at a position 6 mm from the center 0 in the length direction in FIG. 6) of the electromagnetic shielding frame member 14 in the length direction (X direction). The reason why such magnetic field strength distribution in the electromagnetic shielding frame member 14 appears, that is, why the magnetic field strength becomes the largest near the center 0 in the length direction of the electromagnetic shielding frame member 14, is because the magnetic field generated from the bus bar 11 is reflected at any parts of the inner wall surfaces of the electromagnetic shielding frame member 14 (the electromagnetic shielding frame member 14 is provided in order to strictly prevent the propagation of electric waves from the outside of the electromagnetic shielding frame member 14 to the inside, and simultaneously, a function that the electric waves inside the electromagnetic shielding frame member 14 are not propagated outside is also realized.), and such reflected magnetic field may be propagated to pass the parts near the center 0 in the length direction of the electromagnetic shielding frame member 14.

The shape of the electromagnetic shielding frame member 14 is not restricted to a rectangular parallelepiped, but may be other shapes as long as two spaces of the same shape are obtained when the plane which intersects perpendicularly in the length direction of the bus bar 11 divides the inside of the electromagnetic shielding frame member 14. When a dielectric material is enclosed inside the electromagnetic shielding frame member 14, and the plane which intersects perpendicularly in the length direction of the bus bar 11 divides the dielectric material inside the electromagnetic shielding frame member 14, the distribution of the magnetic field strength inside the two spaces may become symmetrical. In short, the magnetic field strength generated from the current path only has to become symmetrically distributed to the plane A which intersects perpendicularly in the length direction of the bus bar 11.

The front and back parts of the two Hall ICs 15, 16 in the bus bar longitudinal direction, as shown in FIG. 4, are arranged to be symmetric to the plane A. These Hall ICs 15, 16 are located at different heights (Z direction) C and D in the electromagnetic shielding frame member 14, as shown in FIG. 5. Here, the two Hall ICs 15, 16 are described to be arranged in positions along the center line B, respectively. Thus, since the Hall ICs 15, 16 are arranged in the positions where the magnetic field strength generated from the bus bar 11 becomes the largest easily, an effect is achieved that the size of a current which flows through the bus bar 11 can be measured with sufficient precision.

Therefore, since the front and back parts of the two Hall ICs 15, 16 in the bus bar longitudinal direction are arranged to be symmetric to the plane A as mentioned above, and the two Hall ICs 15, 16 are located at the different heights (Z direction) C and D in the electromagnetic shielding frame member 14, the two Hall ICs 15, 16 are exposed at places where the magnetic field strength is different. Therefore, the sensitivities of the two Hall ICs 15, 16 are adjusted so that current values outputted according to the detected magnetic fields are identical to each other in a normal state, as described later. That is, the Hall ICs 15, 16 of different characteristics are used. Therefore, each of the Hall ICs 15, 16 will output a current value in an identical level in the normal state.

On the other hand, when the output current values of the Hall ICs 15, 16 arranged as mentioned above differ, it can be determined that either of the Hall ICs 15, 16 fails. FIG. 8 is a failure detecting circuit of the Hall ICs 15, 16. In the failure detecting circuit, an electric current comparator 31 compares the output currents of the Hall ICs 15, 16. Based on this comparison result, a failure determination circuit 32 determines whether either of the Hall ICs 15, 16 fails or both of the Hall ICs 15, 16 are normal, and the determined result is displayed on an indicator 33.

The Hall ICs 15, 16 are arranged to pass the center line B in the widthwise direction of the bus bar 11, and the right and left parts of the Hall ICs 15, 16 in the bus bar widthwise direction become symmetric to a plane A' shown in the FIG. 5 which intersects perpendicularly with the bus bar 11.

The electromagnetic shielding frame member 14 prevents the propagation of electromagnetic waves to the inside of the IC receiving recess 21, and inside the electromagnetic shielding frame member 14 when the bus bar 11 is installed to the electromagnetic shielding frame member 14, the strength of the magnetic field generated from the bus bar 11 is distributed symmetrically to the plane A'. As shown in FIG. 5, the plane A is a plane which passes the center line B (refer to FIG. 4) in the widthwise direction of the bus bar 11 which is extended in the length direction (X direction) of the electromagnetic shielding frame member 14, and intersects perpendicularly with the bus bar 11. In order to cause the strength of the magnetic field generated from the bus bar 11 to be distributed symmetrically to the plane A inside the electromagnetic shielding frame member 14, by causing the shape of the electromagnetic shielding frame member 14 to be a rectangular parallelepiped and setting the plane A' which divides the rectangular parallelepiped into two rectangular parallelepipeds of the same shape, the distribution of the magnetic field strength inside the electromagnetic shielding frame member 14 is symmetric. Then, in the widthwise direction (Y direction) which passes the centers of the Hall ICs 15, 16 and is positioned at a height C in the Z direction from the bottom wall in the electromagnetic shielding frame member 14, the distribution of magnetic flux B1 which the bus bar 11 generates inside the electromagnetic shielding frame member 14 is as shown in FIG. 7. In the distribution of FIG. 7, the width indicates positions in the Y direction with the position of the plane A' as 0, and the vertical axis indicates strength B1 of the magnetic field. Inside the electromagnetic shielding frame member 14, the magnetic field strength is distributed to be the smallest near the center 0 of the bus bar 11 in the widthwise direction, and increase as towards both ends of the bus bar 11 in the widthwise direction. That is, the magnetic field strength is distributed to increase symmetrically from the plane A' towards the both ends of the bus bar 11 in the widthwise direction (Y direction). The reason why such magnetic field strength distribution in the electromagnetic shielding frame member 14 appears is because the cross-section of the bus bar 11 is symmetric in the widthwise direction.

Therefore, since the left and right parts of the two Hall ICs 15, 16 in the bus bar widthwise direction are arranged to be symmetric to the plane A', and the two Hall ICs 15, 16 are located at the different heights (Z direction) C and D in the electromagnetic shielding frame member 14 as mentioned above, the two Hall ICs 15, 16 are exposed at places where the magnetic field strength is different. Therefore, the sensitivities of the two Hall ICs 15, 16 are adjusted so that current values outputted according to the detected magnetic field are identical to each other in a normal state, as described above. Therefore, each of the Hall ICs 15, 16 will output a current value in an identical level. On the other hand, when the output current values of the Hall ICs 15, 16 arranged as mentioned above differ, it can be determined that either of the Hall ICs 15, 16 fails.

The Hall ICs 15, 16 are arranged (separately) along the Z axial direction which is a height direction, and directed to the center (A') in the Y direction which is the bus bar widthwise direction and the center (A) in the X direction which is the bus bar longitudinal direction. When it is assumed that a current of 100 A flows in the bus bar 11, the magnetic flux density B100 which is generated in the Y direction in the width direction center of the bus bar 11 by the current which flows into the bus bar 11 is like, for example, a graph shown in FIG. 9. That is, if the distance L from the surface of the bus bar 11 becomes longer, the magnetic flux density $B_{100}$ will become smaller. For example, the magnetic flux density B100 of the Hall IC 16 at the C position shown in FIG. 5 is 0.07 mT/A, and the magnetic flux density of the Hall IC 15 at the D position is 0.059 mT/A. Thus, since the magnetic flux densities generated at the positions C and D differ from each other, the sensitivities of the Hall ICs 15, 16 are adjusted in order to obtain the same output.

FIG. 10 shows current detection ranges for which a voltage output of 1.5V at the maximum current is possible when two Hall ICs 15, 16 whose sensitivities can be adjusted in a range of 0.05 to 0.3 V/mT are used. These current detection ranges can be obtained with calculation from the magnetic flux density B100 (refer to FIG. 9) at the C and D positions and the sensitivities S of a Hall ICA and a Hall ICB. It can be seen from the graph of FIG. 10 that when the current outputs I of the two Hall ICA and Hall ICB are the same, the overlapped range (85 to 428 A) becomes a failure detectable range. It is possible to measure a wider current range if individual sensitivities are corresponded. That is, as shown in FIG. 10, by changing the outputs of the two Hall ICA and Hall ICB, a wide range current measurement becomes possible. When the two Hall ICA and Hall ICB whose sensitivities can be adjusted in the range of 0.05 to 0.3 V/mT are used, the failure detectable range is 85 to 428 A, and the wide current measurement range is 72 to 508 A.

As described above, according to this embodiment, it is not necessary to include the core in structure like before. It is not necessary to arrange two Hall ICs in parallel to make it possible to compare sensor outputs and determine the failure of a current sensor like a related-art example. Therefore, one magnetic detector is arranged on the same plane, and the simplification and downsizing of a current detection apparatus can be realized.

By changing the sensitivities of the Hall ICs 15, 16, the same outputs are obtained, and by comparing outputs, failure diagnosis can be performed. Thereby, failure determination of a magnetic detector (Hall element) can be performed easily without being affected by an external magnetic field.

If individual sensitivities are set for the Hall ICs 15, 16, a wide current range can be detected with sufficient precision without increasing the size.

Although it is described in this embodiment that a magnetic field which a current flowing in the bus bar 11 generates is detected, a current which flows in current paths other than a bus bar, for example, a usual electric wire, can be detected by using the above-mentioned electromagnetic shielding frame member and the Hall ICs, and failure detection of the Hall elements also can be performed like above.

Although the present invention is described in detail with reference to the embodiments, it is apparent that various modifications and amendments may be made by those skilled in the art without departing from the spirit and scope of the invention.

The present application is based on the Japanese patent application (patent application No. 2010-104291) filed on Apr. 28, 2010, the contents of which are incorporated herein by reference.

Reference Signs List

11: bus bar (current path)
14: electromagnetic shielding frame member
15, 16: Hall IC (magnetic detector)
23: insulative board (board)
23a, 23b: front and back surface
32: failure determination circuit (control circuit)

The invention claimed is:

1. A current detection apparatus, comprising:
   two magnetic detectors that are arranged oppositely on a front surface and a back surface of a board which is located above a current path in order to detect a strength of a magnetic field which is generated by a current which flows in the current path, wherein the two magnetic detectors are located in different distances from the current path;
   an electromagnetic shielding frame member that is mounted on the current path so that the two magnetic detectors and a part of the current path where the two magnetic detectors are arranged are accommodated inside the electromagnetic shielding frame member; and
   a control circuit that determines whether a failure occurs in either of the two magnetic detectors from a difference between magnetic fields detected by the two magnetic detectors, respectively, wherein
   sensitivities of the two magnetic detectors are adjusted so that current values outputted from the two magnetic detectors depending on detected magnetic fields are identical to each other in a normal state.

2. The current detection apparatus according to claim 1, wherein
   each of the two magnetic detectors is arranged to be located at a center of the current path in its widthwise direction.

3. The current detection apparatus according to claim 1, wherein
   the current path is extended in parallel to the board on which the two magnetic detectors are arranged.

* * * * *